United States Patent [19]
Tamura

[11] Patent Number: 6,066,854
[45] Date of Patent: May 23, 2000

[54] METHOD OF WRITING CROSS PATTERN IN ADJACENT AREAS OF LAYER SENSITIVE TO CHARGED PARTICLE BEAM FOR IMPROVING STITCHING ACCURACY WITHOUT SACRIFICE OF THROUGHPUT

[75] Inventor: Takao Tamura, Tokyo, Japan

[73] Assignee: NEC Corporation, Tokyo, Japan

[21] Appl. No.: 09/138,330

[22] Filed: Aug. 24, 1998

[30] Foreign Application Priority Data

Aug. 22, 1997 [JP] Japan ................................ 9-226652

[51] Int. Cl.[7] .................................................. H01J 37/304
[52] U.S. Cl. .................................. 250/492.22; 250/452.23
[58] Field of Search ........................... 250/492.22, 497.23

[56] References Cited

U.S. PATENT DOCUMENTS 5,349,197  9/1994  Sakamoto et al. ................. 250/492.22
5,438,207  8/1995  Itoh et al. ......................... 250/492.23
5,523,580  6/1996  Davis ................................ 250/492.22

FOREIGN PATENT DOCUMENTS

4-176114   6/1992  Japan .
5-26742   10/1993  Japan .
5-299327  11/1993  Japan .

Primary Examiner—Bruce C. Anderson
Attorney, Agent, or Firm—Sughrue, Mion, Zinn, Macpeak & Seas, PLLC

[57] ABSTRACT

A data processor compares a length of a pattern to be written into a layer sensitive to a charged particle beam with a critical length equal to the maximum length of a cross section of the charged particle beam or the maximum length of a variable sub-field to see whether or not the pattern is written through a radiation of the maximized cross section or through a radiation onto the maximized sub-field, and a main deflector and a sub-deflector guide a shot of charged particle beam to the layer if the answer is positive so that the pattern is prevented from deformation due to a low stitching accuracy.

9 Claims, 9 Drawing Sheets

METHOD OF WRITING CROSS PATTERN IN ADJACENT AREAS OF LAYER SENSITIVE TO CHARGED PARTICLE BEAM FOR IMPROVING STITCHING ACCURACY WITHOUT SACRIFICE OF THROUGHPUT

FIELD OF THE INVENTION

This invention relates to a charged particle beam lithography and, more particularly, to a method of writing a cross pattern in adjacent areas of a layer sensitive to a charged particle beam for improving a stitching accuracy without sacrifice of the throughput.

DESCRIPTION OF THE RELATED ART

An integrated circuit device is fabricated on a semiconductor wafer through repetition of a pattern transfer from photo-masks and/or a direct pattern writing. A miniature pattern is desirable for increasing the integration density, and research and development efforts have been made on various lithographic technologies. A charged particle beam lithography is attractive to the manufacturer for transferring a miniature pattern equal to or less than 0.25 micron. An electron beam is, by way of example, used in the charged particle beam lithography.

Figure 1:
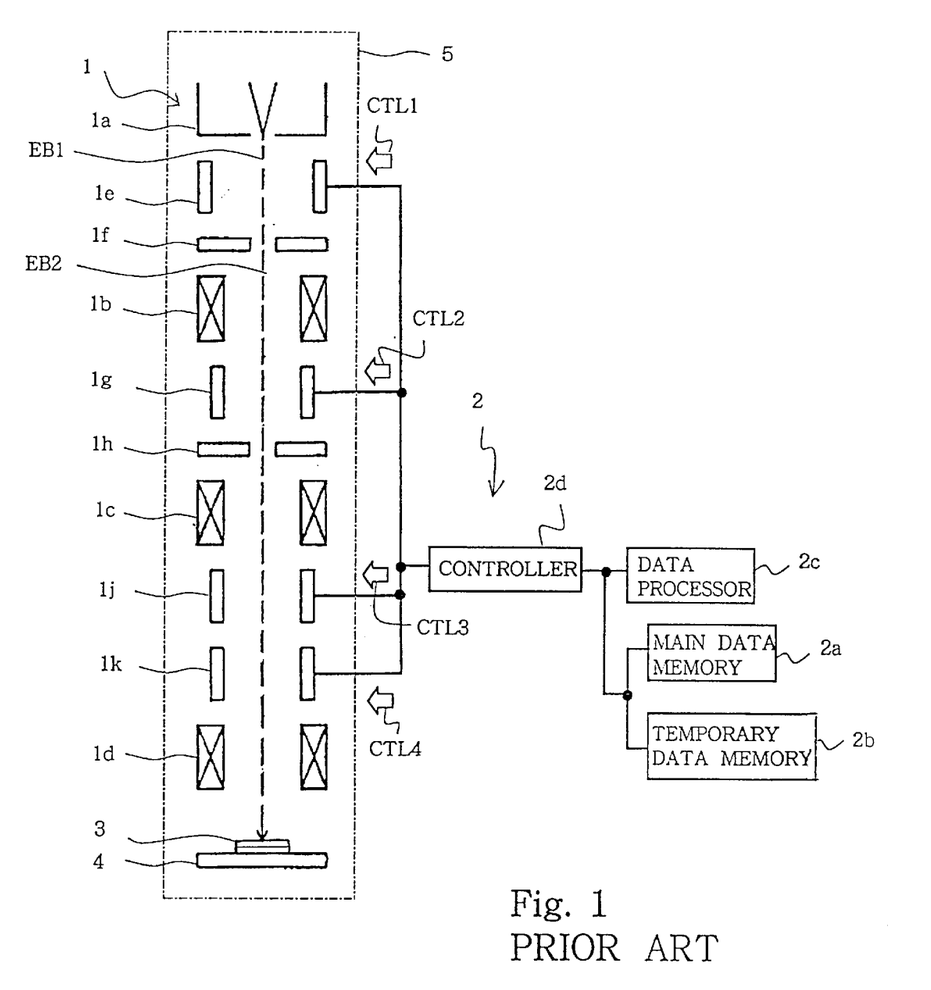
FIG. 1 is a schematic view showing the prior art variable shaped electron beam lithography machine.

FIG. 1 illustrates a standard variable shaped electron beam lithography machine. The standard variable shaped electron beam lithography machine is broken down into an electron optics system 1 and a controlling system 2. A semiconductor wafer is covered with an electron resist layer, and is mounted on a movable stage 4. Reference numeral 3 designates the semiconductor wafer covered with the electron resist layer, which is simply referred to as "semiconductor wafer" hereinbelow. The electron optics system 1 and the movable stage 4 are accommodated in a vacuum chamber 5, and the electron optics system 1 radiates an electron beam EB1 to the semiconductor wafer 3 under the control of the controlling system 2. The electron beam EB1 forms a latent image in the semiconductor wafer 3.

The electron optics system 1 includes an electron gun 1a for generating the electron beam EB1 and three lens units, i.e., a shaping lens unit 1b, a demagnification lens unit 1c and a projection lens unit 1d. The shaping lens unit 1b, the demagnification lens unit 1c and the projection lens unit 1d are provided between the electron gun 1a and the semiconductor wafer 3 along the optical path of the electron beam EB1.

The electron optics system 1 further includes a blanking electrode 1e and a first aperture plate 1f between the electron gun 1a and the shaping lens unit 1b, a beam shaping deflector 1g and a second aperture plate 1h between the shaping lens unit 1b and the demagnification lens unit 1c and a main deflector 1j and a sub-deflector 1k. The blanking electrode 1e changes a dose of each shot of the electron beam EB1, and the first aperture plate 1f and the second aperture plate 1h have respective rectangular apertures 1m/1n (see FIG. 2), and shape the electron beam EB1 into a rectangular cross section.

The controlling system 2 includes a main data memory 2a for pattern data, a temporary data memory 2b, a data processor 2c and a controller 2d. The pattern data is representative of a pattern to be written on a chip forming a part of the semiconductor wafer 3, the coordinates of a shot on the chip and a configuration, and the data processor 2c transfers a piece of pattern data from the main data memory 2a to the temporary data memory 2b. The pattern data is formed from geometric pattern data, and a designer produces the geometric pattern data by using a CAD (Computer Aided Design) system. The geometric pattern data is processed through a computer program, and is converted to the pattern data. The pattern data is transcribed into a predetermined format appropriate to the controller 2d. Undesirable overlap is eliminated from the pattern data, and the proximity effect is corrected in the pattern data.

The piece of pattern data is read out from the temporary data memory 2b, and is supplied to the controller 2d. The controller 2d produces control signals CTL1/ CTL2/ CTL3/ CTL4 from the piece of pattern data, and supplies them to the blanking electrode 1e, the beam shaping deflector 1g, the main deflector 1j and the sub-deflector 1k, respectively.

The electron gun 1a radiates a series of shots of the electron beam EB1 toward the semiconductor wafer 3. The blanking electrodes 1e modifies the dose of each shot, and a shot of electron beam EB1 is incident on the first aperture plate 1f. The shot of electron beam EB1 passes the rectangular aperture 1m, and the first aperture plate 1f shapes the electron beam EB1 into an electron beam EB2 with a rectangular cross section CR1 (see FIG. 2). The electron beam EB2 passes the shaping lens unit 1b and the beam shaping deflector 1g, and the beam shaping deflector 1g deflects the electron beam EG2. The deflected electron beam EB2 is incident on the second aperture plate 1h, and the rectangular cross section CR1 is offset from the rectangular aperture 1n. Part of the electron beam EB2 passes the rectangular aperture 1n, and is hatched in FIG. 2. The hatched cross section CR1 is varied by changing the deflecting angle. Thus, the beam shaping deflector 1g and the second aperture plate 1h form the electron beam EB2 into an electron beam EB3 with a different cross section CR2. In other words, the first aperture plate 1f, the shaping deflector 1g and the second aperture plate 1h form a pattern CR2 to be written onto the semiconductor wafer 3, and the shaping deflector 1g varies the cross section CR2 or the pattern to be written onto the semiconductor wafer 3.

The demagnification lens unit 1c further makes the cross section CR2 narrower, and the main/ sub defectors 1j/1k deflect the electron beam EB3. The shot of electron beam EB3 is incident on a narrow area of the semiconductor wafer 3, and forms a latent image in the electron resist layer. The blanking electrode 1e repeats the image transfer through a shot of the electron beam EG3.

Figure 3:
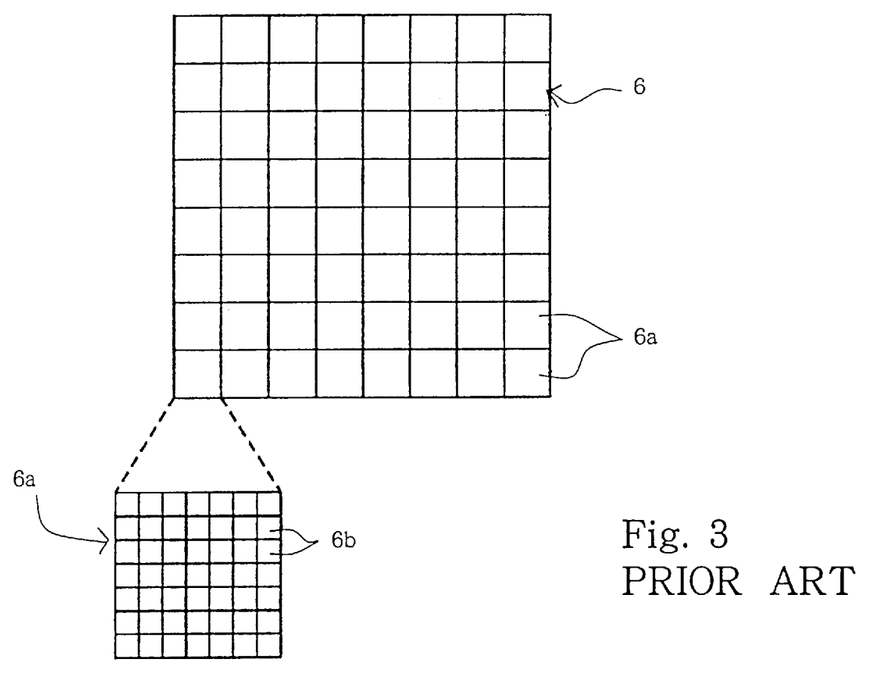
FIG. 3 is a plane view showing the semiconductor chip divided into the plural sub-fields.

An integrated circuit device is assumed to occupy a rectangular area 6 on the major surface of the semiconductor wafer 3 (see FIG. 3). When the semiconductor wafer 3 is separated into semiconductor chips, the rectangular area 6 forms one of the semiconductor chips. The rectangular area 6 is virtually divided into plural rectangular fields 6a, and each rectangular field 6a is further virtually divided into narrow rectangular sub-fields 6b. The plural sub-fields are two-dimensionally arranged like a lattice.

Figure 4:
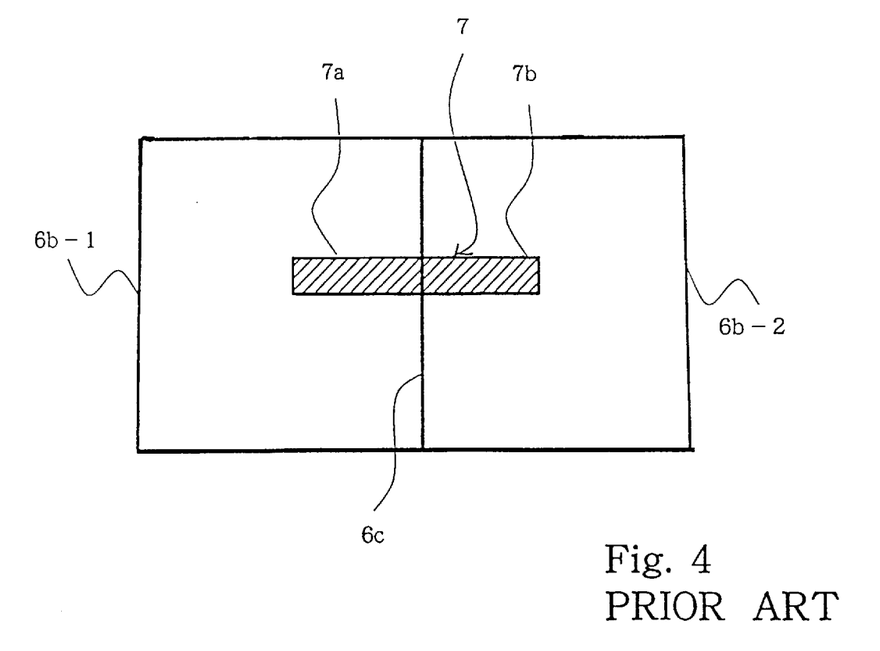
FIG. 4 is a plane view showing the pattern extending across the boundary between the sub-fields.

The field 6a is automatically divided into the sub-fields 6b regardless of the patterns to be written. For this reason, there is a possibility that a pattern 7 extends across the boundary 6c between the adjacent sub-fields 6b-1/6b-2 as shown in FIG. 4. The pattern 7 is hatched so as to be easily discriminated from the sub-fields 6b-1/6b-2. The pattern 7 is partially in the sub-field 6b-1 and partially in the other sub-field 6b-2 as indicated by references 7a/7b, and the sub-patterns 7a/ 7b are written through different shots of electron beam EB3. The sub-pattern 7a is firstly written through a shot of electron beam EB3 onto the left sub-field 6b-1, and, thereafter, the main deflector 1j moves another shot of electron beam EB3 to the right sub-field 6b-2. The other sub-pattern 7b is written through another shot of electron beam EB3 onto the right sub-field 6b-2.

The main deflector 1j moves the electron beam EB3 from the left sub-field 6b-1 to the right sub-field 6b-2, and the deflection deteriorates the latent image of the piece of pattern 7 due to the stitching accuracy. Moreover, when one of the sub-patterns 7a/ 7b is much narrower than the other sub-pattern, the latent image of the narrower sub-pattern shrinks from the designed geometries due to small amount of current density. When the prior art variable shaped electron beam lithography machine is used for a miniature pattern equal to or less than 0.25 micron wide, the pattern deformation due to the low stitching accuracy and the shortage of current density is serious, and reduces the production cost.

Figure 5:
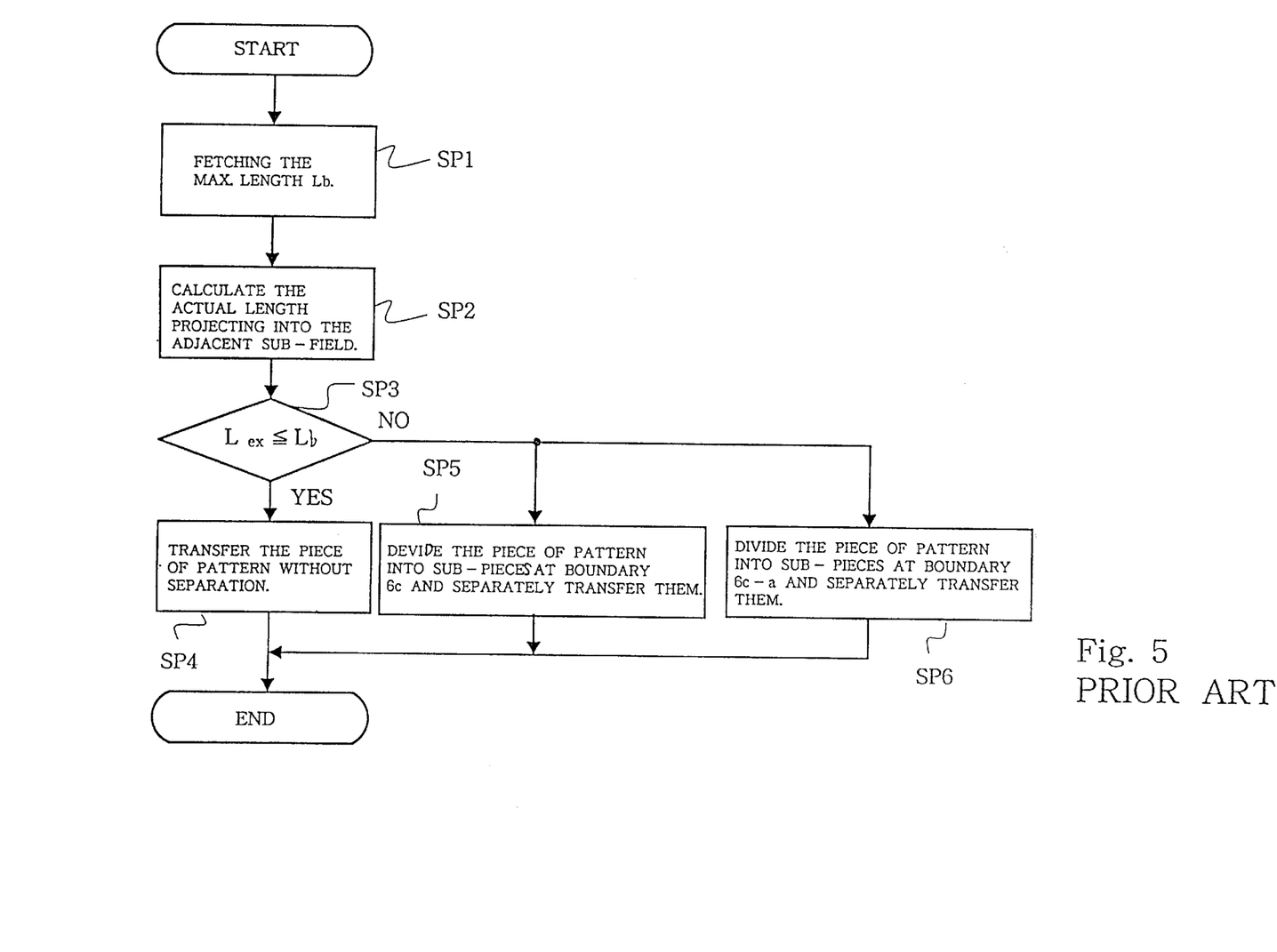
FIG. 5 is a flow chart showing the prior art program sequence for temporarily expanding a sub-field assigned to the major part of the piece of pattern extending across the boundary between the sub-fields.

One of the approaches for the solution is to expand a sub-field assigned to the major part of the pattern 7. FIG. 5 illustrates the prior art program sequence for expanding the sub-field. In the following description, the sub-pattern 7a is assumed to be longer than the other sub-pattern 7b. The data processor 2c starts the prior art program sequence with fetching the critical length Lb allowed to project from the sub-field 6b-1 into the adjacent sub-field 6b-2 as by step SP1. The critical length Lb is less than the maximum length of the cross section CR2.

Subsequently, the data processor 2c calculates the actual length Lex of the sub-pattern 7b projecting into the adjacent sub-field 6b-2 as by step SP2. The data processor 2c compares the actual length Lex with the critical length Lb to see whether or not the length Lex is equal to or less than the critical length Lb as by step SP3. There are three options depending upon the result of the comparison.

Figure 6:
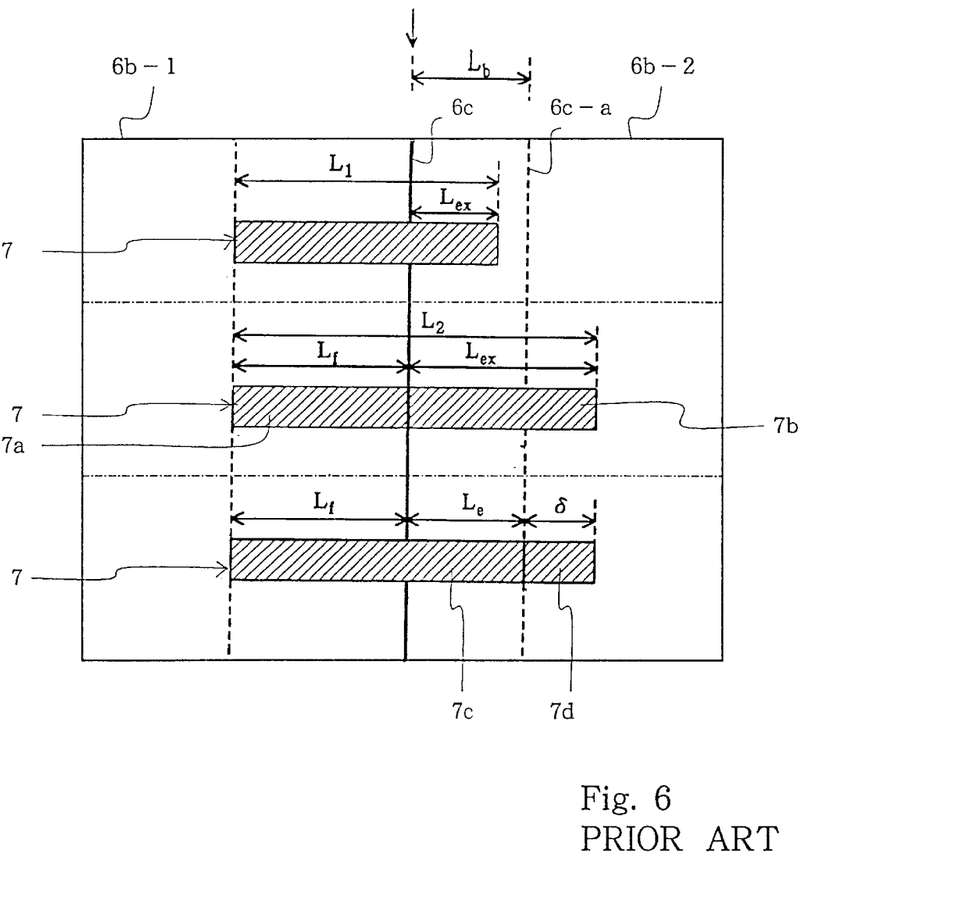
FIG. 6 is a view showing the cross patterns written into the sub-fields.

If the actual length Lex is equal to or less than the critical length Lb, the answer at step SP3 is given affirmative, and the data processor 2c proceeds to step SP4. The data processor 2c ignores the boundary 6c as if the sub-fields 6b-1 and 6b-2 form a boundary 6c-a as shown in FIG. 6. The data processor 2c instructs the controller 2d to write the pattern 7 with length L1 to the semiconductor wafer through the single shot of electron beam EB3. As a result, the pattern 7 is never separated into the sub-patterns 7a/ 7b, and is prevented from deformation.

If the actual length Lex is greater than the critical length Lb, the data process 2c proceeds to either step SP5/SP6. When the data processor 2c takes step SP5, the boundary 6c is maintained, and the pattern 7 with length L2 is divided into the sub-pattern 7a with length Lf and the sub-pattern 7b with length Lex. The sub-pattern 7a is written through a shot of electron beam EB3 onto the sub-field 6b-1. The main deflector moves the next shot of electron beam EB3, and the sub-pattern 7b is written through the next shot onto the sub-field 6b-2. Thus, the piece 7 of pattern is written through two shots of electron beam EB3, and the manufacturer suffers from a low stitching accuracy.

When the data processor 2c takes step SP6, the pattern 7 is divided into a sub-pattern 7c with length (Lf+Le) and a sub-pattern 7d with length δ at the boundary 6c-a, and the prior art electron beam lithographic machine separately writes them through two shots of electron beam EB3 onto the semiconductor wafer. The sub-pattern 7d is so short that the manufacturer suffers from not only a low stitching accuracy but also deformation of the latent image due to shortage of current density.

Another approach is disclosed in Japanese Patent Publication of Unexamined Application Nos. 5-267142 and 4-176114. Both prior art methods propose to multiply radiate electron beam onto an overlapping area between sub-fields, and the multiple radiation improves the stitching accuracy.

In the prior art method disclosed in Japanese Patent Publication of Unexamined Application No. 5-267142, sub-fields are defined in such a manner that adjacent sub-fields overlap one another. If there is a cross pattern extending over adjacent two sub-fields, the cross pattern is formed into two sub-patterns assigned to the two sub-fields, respectively. The two-sub-patterns partially overlap each other, because the sub-patterns are to be written in the individual sub-fields. The sub-patterns are written into the individual sub-fields through shots of electron beam, respectively, and the electron is multiply introduced into the overlapping area of the adjacent sub-fields.

In the other prior art method disclosed in Japanese Patent Publication of Unexamined Application No. 4-176114, the sub-fields form boundaries without any overlapping area. If there is a cross pattern extending over the boundary between adjacent two sub-fields, the cross pattern is formed into two sub-patterns assigned to the adjacent sub-fields. One of the sub-patterns projects from the associated sub-field into the adjacent sub-field, and the other sub-pattern also projects from the associated sub-field into the adjacent sub-field. For this reason, the sub-patterns overlap each other in the predetermined overlapping area on both sides of the boundary.

Although both prior art methods improve the stitching accuracy through the multiple electron radiation onto the overlapping area, a cross pattern is divided into sub-patterns, and each sub-pattern is written through a shot of electron beam. This means that the cross pattern requires plural shots of electron beam. The multiple pattern transfer consumes long time, and the manufacturer suffers from a low throughput.

Yet another approach is disclosed in Japanese Patent Publication of Unexamined Application No. 5-299327. The Japanese Patent Publication of Unexamined Application proposes to give a priority of pattern writing to a narrower cross pattern. As a result, if there are cross patterns to be written into sub-fields, the cross pattern is divided into sub-patterns at the boundary of the sub-fields, and the pattern transfer is carried out from a narrow cross pattern to a wide cross pattern. This is effective against a step due to a beam drift. However, when there are cross patterns, a controller is required to rearrange the patterns to be written into the sub-fields, and consumes long time.

SUMMARY OF THE INVENTION

It is therefore an important object of the present invention to provide a method of writing a cross pattern, which is improved in stitching accuracy without sacrifice of the throughput of a charged particle beam lithographic machine.

To accomplish the object, the present invention proposes to write a cross pattern not longer than a corresponding edge line of the maximum cross section of a charged particle beam through a single shot of the charged particle beam or expand a sub-field so as to write the cross pattern therein.

In accordance with one aspect of the present invention, there is provided a method for writing a pattern in adjacent areas of a layer formed of material sensitive to a charged particle beam comprising the steps of a) determining a length of the pattern, b) comparing the length with a critical length equal to the maximum length of a variable cross section of the charged particle beam to see whether or not the length is greater than the critical length and c) radiating a shot of the charged particle beam onto the adjacent areas so as to write the pattern in the adjacent areas when the length is not greater than the critical length, otherwise, the pattern is divided into sub-patterns so as to write the sub-patterns in the adjacent areas through plural shots of the charged particle beam radiated onto the adjacent areas when the length is greater than the critical length.

In accordance with another aspect of the present invention, there is provided a method for writing a pattern in a layer formed of material sensitive to a charged particle beam comprising the steps of a) determining a length of the pattern and a starting point of the length, b) comparing the length with a critical length equal to a maximum length of a first area maximized in the layer to see whether or not the length is greater than the critical length and c) radiating a shot of the charged particle beam onto a second area of the layer having a corner coincident with the starting point and an edge line equal to the length so as to write the pattern in the second area when the length is equal to or less than the critical length, otherwise, the pattern is divided into sub-patterns written into the first area and a third area adjacent to the first area when the length is greater than the critical length.

BRIEF DESCRIPTION OF THE DRAWINGS

The features and advantages of the method will be more clearly understood from the following description taken in conjunction with the accompanying drawings in which.

DESCRIPTION OF THE PREFERRED EMBODIMENTS

First Embodiment

Figure 7:
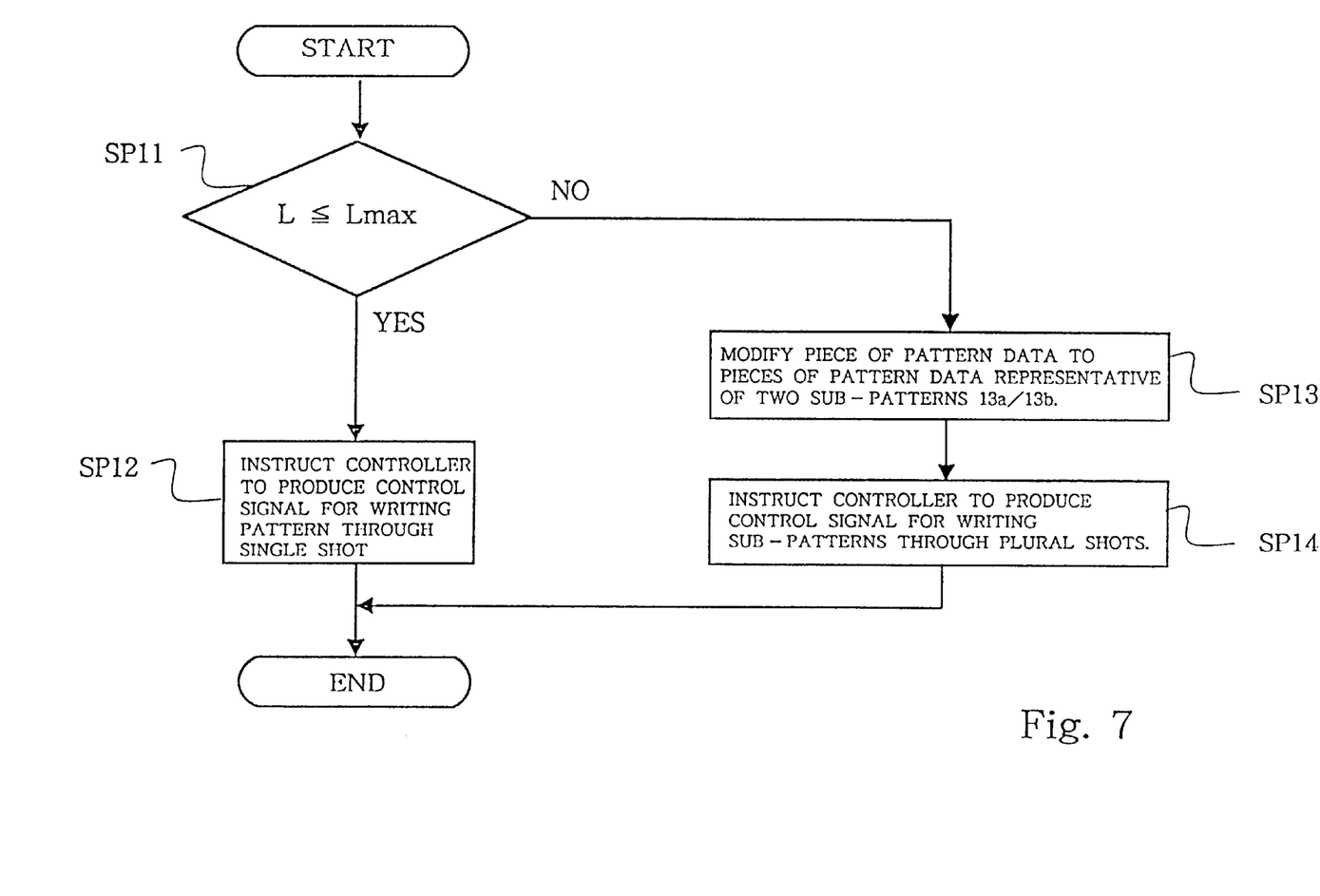
FIG. 7 is a flow chart showing a program sequence for a method according to the present invention.

FIG. 7 illustrates a program sequence for a method embodying the present invention. The method implementing the first embodiment is realized by a charged particle beam lithographic machine similar to the lithographic machine shown in FIG. 1. For this reason, no description is made on the charged particle beam lithographic machine, and components of the lithographic machine are specified by using the references designating corresponding components of the variable shaped electron beam lithographic machine shown in FIG. 1, if necessary. In this instance, the first aperture plate 1f, the beam shaping deflector 1g and the second aperture plate 1h as a whole constitute a beam shaping means. The main deflector 1j deflects each shot of charged particle beam over a layer sensitive to the charged particle beam, and the sub-deflector 1k defects each shot in a sub-field.

Figure 8:
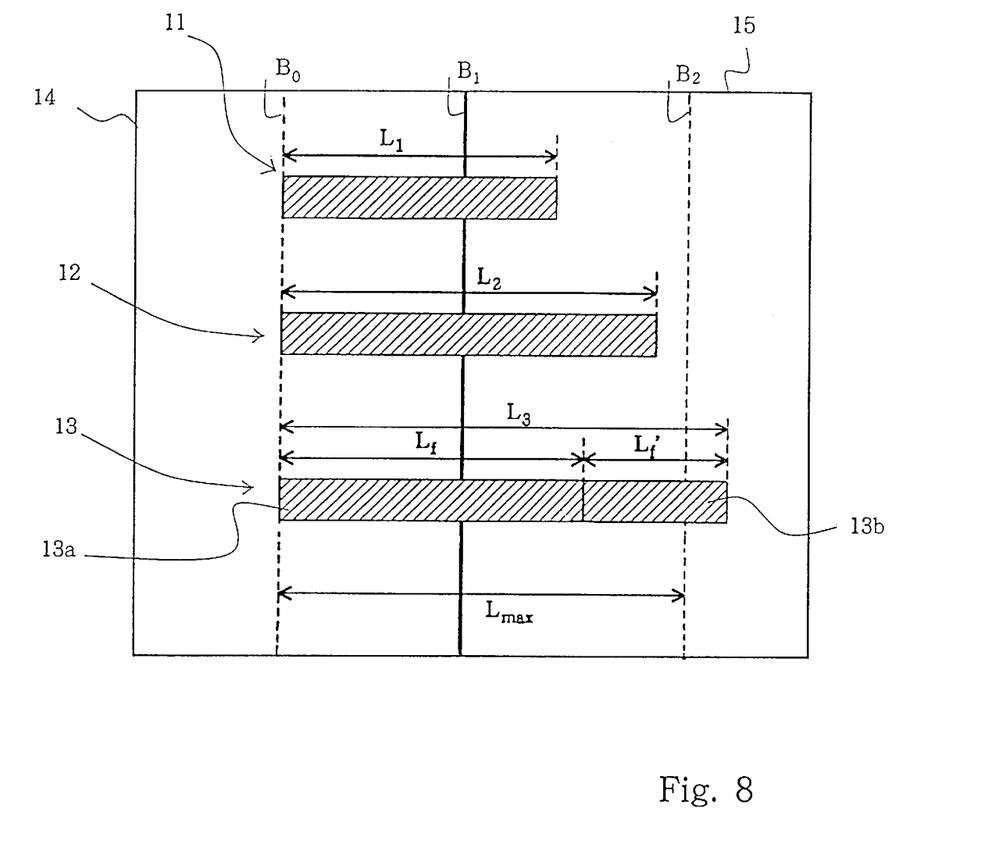
FIG. 8 is a view showing cross patterns written into a layer sensitive to a charged particle beam through the method according to the present invention.

Latent images 11, 12 and 13 of three different cross patterns are formed in adjacent sub-fields 14 and 15 of a charged particle sensitive layer (not shown) through the program sequence. In the following description, not only the latent image but also the patterns are designated by references 11, 12 and 13. The adjacent sub-fields 14 and 15 form a boundary B1, and L1, L2 and L3 represent the length L of the latent images or the patterns 11, 12 and 13 in a direction perpendicular to the boundary B1. The perpendicular direction is assumed to be perpendicular to an edge EG1 of the cross section CR2 (see FIG. 2). As described hereinbefore, the shaping deflector 1g varies the cross section CR2, and the maximum length of the edge EG1 serves as a critical length Lmax. The critical length Lmax is stored in the main data memory 2a as a piece of control data. The main memory 2a further stores pieces of pattern data representative of patterns 11, 12 and 13 together with other pieces of pattern data representative of non-cross patterns and other cross pattern.

Assuming now that the data processor 2c has transferred the pieces of pattern data representative of the pattern 11, 12 and 13 from the main data memory 2a to the temporary data memory 2b, the data processor 2c fetches one of the pieces of pattern data from the temporary data memory 2b and, thereafter, the piece of control data representative of the critical length Lmax from the main data memory 2a. The piece of pattern data contains a sub-piece of pattern data representative of the length L of the pattern to be written onto the charged particle sensitive layer.

The data processor 2c compares the length L with the critical length Lmax to see whether or not the length L is equal to or less than the critical length Lmax as by step SP11. If the piece of pattern data represents either cross pattern 11 or 12, the answer at step SP11 is given affirmative, and the data processor 2c instructs the controller 2d to produce the control signals CTL2/ CTL3/ CTL4 for writing the pattern 11/ 12 through a single shot of the electron beam EB3 as by step SP12. The boundary between the sub-fields 14 and 15 is changed from B1 to B2. Although the pattern 12 is longer than the critical length Lb of the prior art method, the length L2 is less than the critical length Lmax of the method according to the present invention, and the latent image 12 is formed through the single shot of the electron beam EB3, and the latent image 12 is free from the deformation due to a low stitching accuracy. Moreover, the pattern transfer through the single shot consumes time period shorter than that of the pattern transfer in the prior art method.

On the other hand, if the piece of pattern data represents the pattern 13, the answer at step SP11 is given negative, and the data processor 2c modifies the piece of pattern data to pieces of pattern data representative of two sub-patterns 13a/ 13b, because the pattern 13 is too long to be written into the sub-fields 14/ 15 through a single shot of electron beam EB3 as by step SP13. The sub-pattern 13b is partially on the left side of the boundary B2 and partially on the right side thereof. As a result, the sub-pattern 13a has length Lf, and the other sub-pattern 13b has length Lf.

The data processor 2c instructs the controller 2d to supply the control signals CTL2/ CTL4 to the shaping deflector 1g and the sub-deflector 1d so as to write the sub-pattern 13a through a single shot, vary the deflection angle and write the other sub-pattern 13b through the next shot as by step SP14. Both of the sub-pattern 13a and part of the sub-pattern 13b are on the left side of the boundary B2, and, for this reason, the controller 2d does not supply the control signal CTL3 to the main deflector 1j. For this reason, the stitching accuracy is improved rather than the sub-patterns 7c/ 7d shown in FIG. 6.

The manufacturer determined the critical length Lb in the prior art method on the basis of the following requirement. A variable shaped electron beam lithography machine had a default value of the critical length Lb, and the default value was less than the maximum length of the cross section. However, nobody noticed the expansion beyond the default value. Although the critical length Lb rescued the uppermost pattern in FIG. 6, the middle pattern and the lowermost pattern in FIG. 6 were divided. The present inventor tried to make the critical length equal to Lmax, and confirmed good stitching accuracy of all the pattern equal to or less than the critical length Lmax.

As will be appreciated from the foregoing description, when the charged particle beam lithographic machine writes the cross patterns 11/ 12 in the adjacent sub-fields 14/ 15 through the method according to the present invention, the lithographic machine transfers the pattern defined by the second aperture plate to the adjacent sub-fields 14/ 15 through one shot of the electron beam EB3 in so far as the length L is not greater than the critical length Lmax of the pattern. As a result, the cross patterns to be written through more than one shot are drastically decreased. This results in that a large number of cross patterns are free from a low stitching accuracy due to the pattern transfer through plural shots. Moreover, the reduction of shots results in improvement of the throughput.

Although the cross pattern 13 is written into the adjacent sub-fields 14/ 15 through two shots, the cross pattern 13 is divided into two sub-patterns 13a/ 13b in such a manner that the sub-pattern 13a and the part of the other sub-pattern 13b are on one side of the boundary B2, and the charged particle beam lithographic machine writes both sub-patterns 13a/ 13b without changing the deflection angle of the main deflector. For this reason, the sub-patterns 13a/ 13b are connected to each other at improved stitching accuracy.

Second Embodiment

Figure 9:
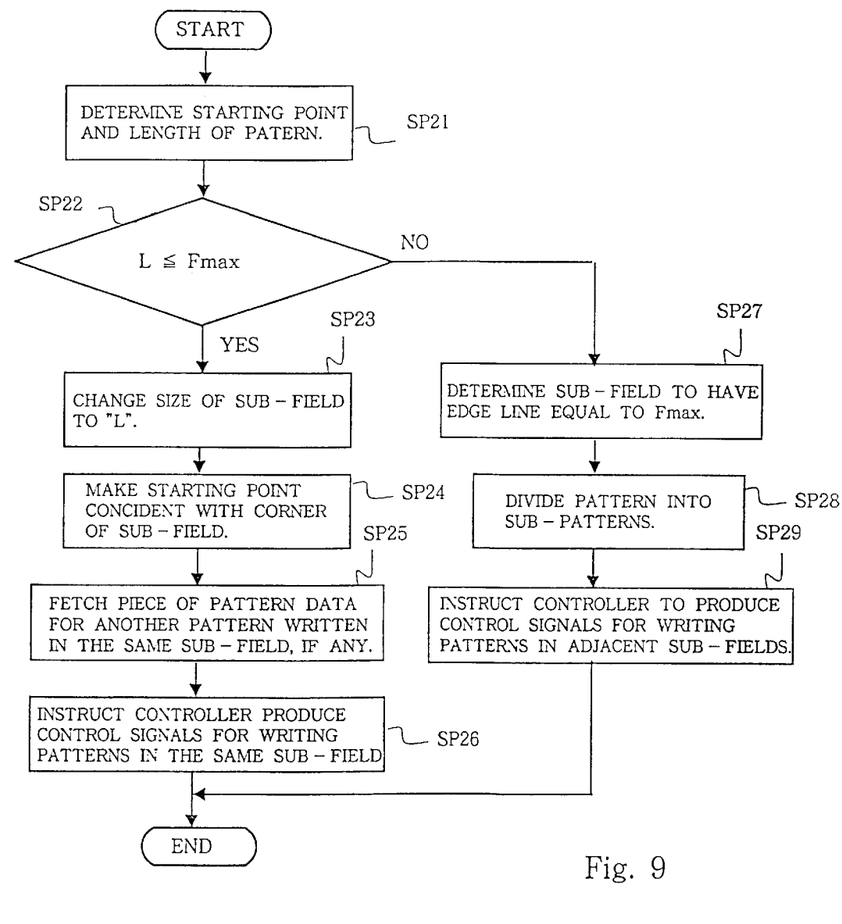
FIG. 9 is a flow chart showing a program sequence for another method according to the present invention.

FIG. 9 illustrates another program sequence embodying the present invention. The program sequence is used in a charged particle beam lithographic machine similar to the variable shaped electron beam lithographic machine, and components of the charged particle beam lithographic machine are accompanied with the references designating corresponding components of the variable shaped electron beam lithographic machine in the following description.

Figure 10:
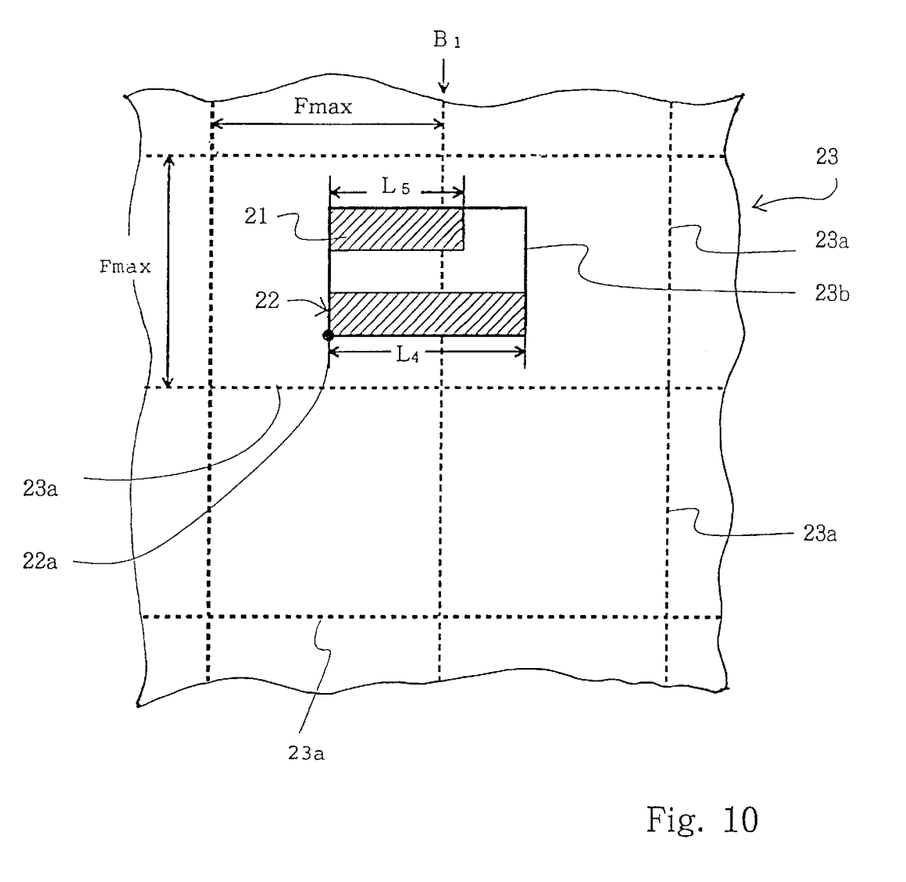
FIG. 10 is a view showing cross patterns written into a layer sensitive to a charged particle beam through the method shown in FIG. 9.

FIG. 10 illustrates patterns 21/ 22 to be written into a layer 23 sensitive to a charged particle beam. The layers 23 are virtually divided into sub-fields 23a of the maximum size as indicated by broken lines. The size of the sub-fields 23a is variable, and "F" represents the length of the edge line defining the sub-field 23a. The sub-field 23a measures Fmax×Fmax, and Fmax is stored in the main memory 2a. In this instance, a critical length is equal to the maximum length Fmax, and is also represented by "Fmax". When the charged particle beam lithographic machine writes the patterns 21/ 22 on the layer 23, the data processor 2c sequentially execute programmed instructions realizing the program sequence shown in FIG. 9. Pieces of pattern data have been already transferred from the main data memory 2a to the temporary data memory 2b, and are representative of the patterns 21/ 22.

The data processor 2c determining a starting point 22a and the length L of the pattern 22 to be written into the layer 23 as by step SP21. The length L of the pattern 22 is L4, and the length L of the other pattern 21 is L5.

Subsequently, the data processor 2c fetches the piece of control data representative of Fmax, and compares the length L with the critical length Fmax to see whether or not the length L is equal to or less than the critical length Fmax as by step SP22.

If the length L is not greater than the critical length Fmax, the answer at step SP22 is given affirmative, and the data processor 2c proceeds to step SP23. The data processor 2c changes the sub-field 23a to have the edge line F equal to L4 as by step SP23, and makes the starting point 22a coincident with one of the corner of the sub-field 23b as by step SP24. Even through the patterns 21/ 22 extend over the boundary between the adjacent sub-fields 23a, they are written in the sub-field 23b without extending over any boundary, and the patterns 21/ 22 are written in the sub-field 23b without division into sub-patterns. This means that the patterns 21/ 22 are free from deformation due to a low stitching accuracy.

Subsequently, the data processor 2c checks the temporary memory 2b to see whether or not any pattern is written in the same sub-field 23b. The pattern 21 is written in the same sub-field 23b, and the answer is given affirmative. Then, the data processor 2c fetches the piece of pattern data representative of the pattern 21 from the temporary data memory 2b as by step SP25.

Subsequently, the data processor 2c instructs the controller 2d to produce the controlling signals for writing the patterns 21/ 22 in the sub-field 23b as by step SP26. The main deflector 1j does not change the deflecting angle while writing each pattern 21 or 22, because they belong to the same sub-field 23b.

On the other hand, if the length L is greater than the critical length Fmax, the answer at step SP22 is given negative, and the data processor 2c proceeds to step SP27. The data processor 2c determines the sub-field to have the maximum size as by step SP27, and divides the pattern into sub-patterns as by step SP28. The data processor 2c instructs the controller 2d to write the pattern 22 in the adjacent sub-fields as by step SP29. The pattern 22 may be divided into sub-patterns, and the sub-patterns are written into the adjacent sub-fields through plural shots of the charged particle beam.

As will be understood from the foregoing description, the sub-field is expanded or shrunk depending upon the length L of the pattern, and, accordingly, the cross patterns to be written into plural sub-fields are decreased. Thus, the cross patterns are decreased, and the throughput is improved Although particular embodiments of the present invention have been shown and described, it will be obvious to those skilled in the art that various changes and modifications may be made without departing from the spirit and scope of the present invention.

For example, the method according to the present invention is available for a pattern writing operation through an ionic beam or a positive electron beam.

Figure 2:
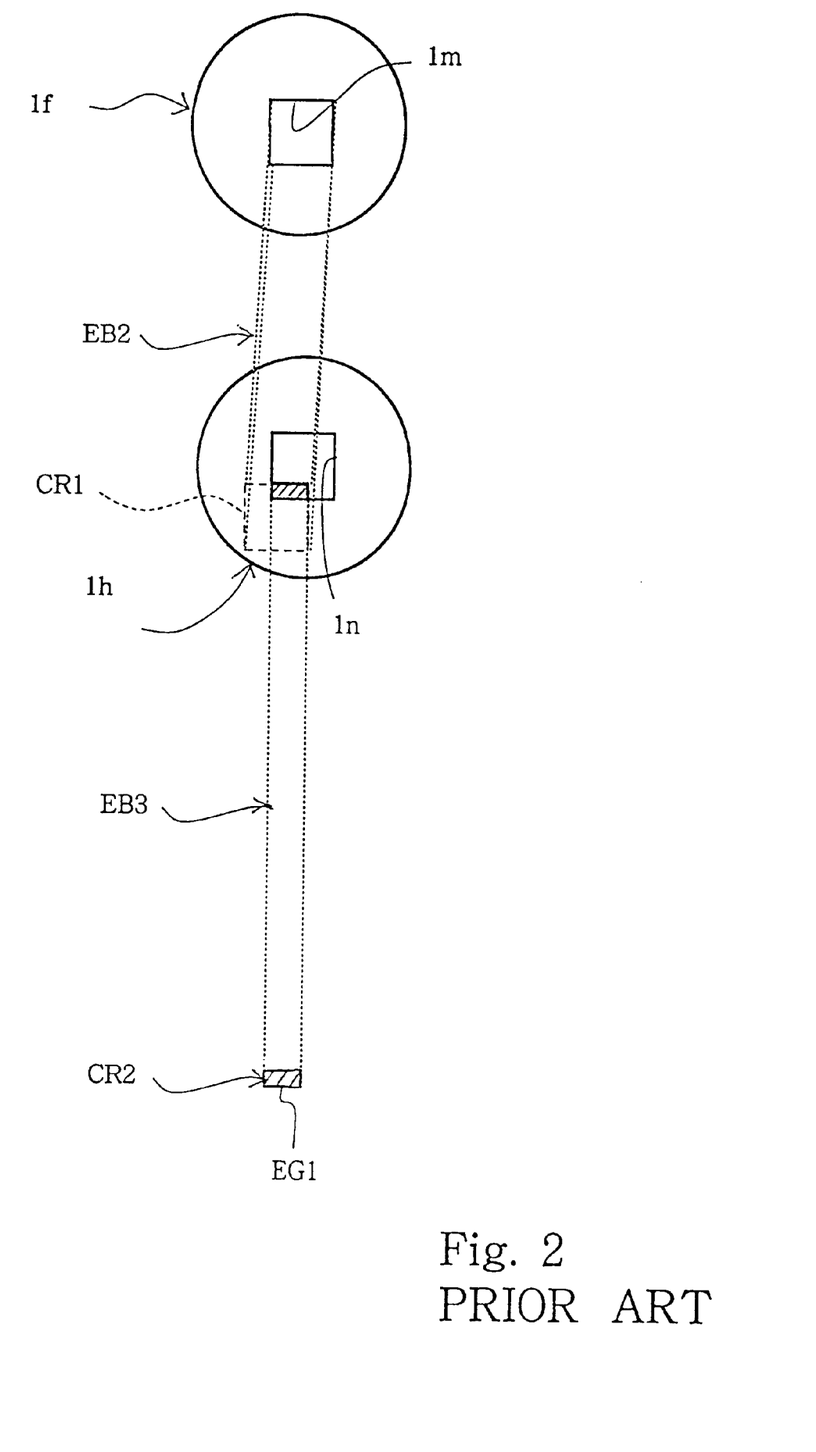
FIG. 2 is a view showing the aperture plates incorporated in the prior art variable shaped electron beam lithography machine.

A cross pattern may be oriented to one direction, and another cross pattern to the direction perpendicular to the one direction. In this instance, the critical length Lmax for one cross pattern is equal to the maximum length of one edge line of the cross section CR2, and the critical length Lmax for another cross pattern is equal to the maximum length of another edge line perpendicular to the one end line.

When the second aperture plate has a square opening, the maximum lengths are equal to one another.

What is claimed is:

1. A method for writing a pattern in adjacent areas of a layer formed of material sensitive to a charged particle beam, comprising the steps of:
   a) determining a length of said pattern;
   b) comparing said length with a critical length equal to the maximum length of a variable cross section of said charged particle beam to see whether or not said length is greater than said critical length; and
   c) radiating a shot of said charged particle beam onto said adjacent areas so as to write said pattern in said adjacent areas when said length is not greater than said critical length,
   said pattern being divided into sub-patterns so as to write said sub-patterns in said adjacent areas through plural shots of said charged particle beam radiated onto said adjacent areas when said length is greater than said critical length.

2. The method as set forth in claim 1, in which one of said sub-patterns is written into one of said adjacent areas, and the other of said sub-patterns crosses a boundary between said adjacent areas.

3. The method as set forth in claim 2, in which said step a) to said step c) are sequentially executed by a charged particle beam lithographic machine having a source of said plural shots of said charged particle beam, a blanking unit for modifying a dose of each shot, a beam shaping means for varying a cross section of each shot, a main deflector for deflecting said each shot over said layer and a sub-deflector for deflecting said each shot in each of said adjacent areas, and one of said sub-patterns and said other of said sub-patterns are written into said adjacent areas without a deflection by using said main deflector.

4. The method as set forth in claim 3, in which said source of said charged particle beam radiates one of an electron beam, an ionic beam and a positron beam.

5. The method as set forth in claim 1, in which said maximum length is indicative of an edge line of said cross section corresponding to an edge line of said pattern indicated by said length.

6. A method for writing a pattern in a layer formed of material sensitive to a charged particle beam, comprising the steps of:
   a) determining a length of said pattern and a starting point of said length;
   b) comparing said length with a critical length equal to a maximum length of a first area maximized in said layer to see whether or not said length is greater than said critical length; and
   c) radiating a shot of said charged particle beam onto a second area of said layer having a corner coincident with said starting point and an edge line equal to said length so as to write said pattern in said second area when said length is equal to or less than said critical length,
   said pattern being divided into sub-patterns written into said first area and a third area adjacent to said first area when said length is greater than said critical length.

7. The method as set forth in claim 6, further comprising the step of searching pieces of pattern data representative of other patterns to see whether any one of said other patterns is written in said second area together with said pattern between said step b) and said step c) when said length is equal to or less than said critical length.

8. The method as set forth in claim 7, in which said step a) to said step c) are sequentially executed by a charged particle beam lithographic machine having a source of said plural shots of said charged particle beam, a blanking unit for modifying a dose of each shot, a beam shaping means for varying a cross section of each shot, a main deflector for deflecting said each shot over said layer and a sub-deflector for deflecting said each shot in each of said first area, said second area and said third area, and said pattern and another pattern are written into said second area without a deflection by using said main deflector.

9. The method as set forth in claim 8, in which said source of said charged particle beam radiates one of an electron beam, an ionic beam and a positron beam.

* * * * *